United States Patent [19]

Hannon et al.

[11] Patent Number: 5,206,861
[45] Date of Patent: Apr. 27, 1993

[54] SYSTEM TIMING ANALYSIS BY SELF-TIMING LOGIC AND CLOCK PATHS

[75] Inventors: Nicholas P. Hannon; Albert Tarolli, both of Kingston; Paul L. Wiltgen, Hurley, all of N.Y.

[73] Assignee: International Business Machines Corporation, Armonk, N.Y.

[21] Appl. No.: 574,639

[22] Filed: Aug. 28, 1990

[51] Int. Cl.[5] ............................................. H04B 17/00
[52] U.S. Cl. ................................... 371/22.3; 371/28; 371/61
[58] Field of Search ................... 371/22.3, 28, 61, 62

[56] References Cited

U.S. PATENT DOCUMENTS

| | | | |
|---|---|---|---|
| 4,477,870 | 10/1984 | Kraus | 371/62 X |
| 4,876,501 | 10/1989 | Ardini et al. | 371/62 X |
| 4,893,072 | 1/1990 | Matsumoto | 371/22.3 |
| 4,972,412 | 11/1990 | Satoh | 371/62 X |
| 5,077,740 | 12/1991 | Kanuma | 371/22.3 |

*Primary Examiner*—Robert W. Beausoliel, Jr.
*Assistant Examiner*—Allen M. Lo
*Attorney, Agent, or Firm*—Lynn L. Augspurger

[57] ABSTRACT

A system and method of determining the propagation delay between LSSD (Level Sensitive Scan Delay) latch pairs is performed by modifying system and scan clock sequences. A set bit is initially scanned to the input of the sending trigger. This is done by inhibiting the last B clock. These A and B clocks are then gated off and the system clocks operate a complete cycle with the unique sequence of inhibiting the first latch pulse and the last trigger pulse. Finally, a unique scan clock sequence is used to scan out data from the receiving latch. If the data scanned out corresponds with expected data (the set bit), the process is repeated decreasing the cycle time of the system clocks until the set bit is no longer received. The measured delay is then taken as the preceding cycle time. By measuring the delays between a plurality of points and a common originating point and taking the differences in these delays, the skew in a clock distribution system can be readily determined.

12 Claims, 7 Drawing Sheets

SYSTEM TIMING ANALYSIS BY SELF-TIMING LOGIC AND CLOCK PATHS

BACKGROUND OF THE INVENTION

1. Field of the Invention

The present invention generally relates to computer logic system testing and, more particularly, to the testing of path delays through a functional organization of logic utilized in, for example, large, complex digital computer systems implemented with high density, large scale integrated circuits. The invention facilitates the analysis of dynamic clock system performance in large, complex digital computer systems.

2. Description of the Prior Art

Propagation delay in large scale computing systems has been, from the beginning, a factor in the performance of those systems. Therefore, it has been routine to test the delay paths between modules of a computing system in order to adjust and fine tune the system for optimum performance. Such measurements were relatively easy to perform when the components of the system were discrete and test pads could be designed into the circuitry. For example, accessible paths could be timed physically using oscilloscopes and probes. However, the capacitance from the probes adversely affects the delays being measured, thereby producing significant error in the measurements themselves. As the cycle times of these large systems decrease, the adverse effects of these probes continue to grow.

With the advent of large scale circuit integration, the problem of measuring path delays has become increasingly difficult. In current technology, timing of these paths using measurement probes is virtually impossible, given the density of the logic and the extremely limited physical access to probing points. This will only become more difficult as chip and component densities increase. Performing this task with an oscilloscope and probes is no longer feasible.

Another prior art method for finding path delay is with specially written software which estimates the delays of the circuits in a given logic path. This method has a significant drawback since it is only an estimation of the delay. For instance, the delays used by the program may have been incorrectly coded or the hardware built may not actually reflect the delay values used by the program.

Hand calculations are also used to find the delay of logic paths. This method is also susceptible to error since there may exist little or no correlation between the mathematical equations used in the calculations and the physical delays of the actual hardware.

Each of these prior art measurement techniques introduces some degree of inaccuracy and lack of confidence in the results. The prior art methods are also very time consuming.

An early solution to the problem of measuring the propagation delay of a functional logic system was provided by E. B. Eichelberger in U.S. Pat. No. 3,784,907. The logical units testable according to the Eichelberger method employ clocked d.c. latches for all internal storage circuitry in the arithmetic/logical units (ALUs) of the computing system. This latch circuitry is partitioned along with associated combinatorial logic networks and arranged in sets. The plural clock trains are synchronous but non-overlapping and independent. The storage circuitry has the capability for performing scan-in/scan-out operations independently of the system input/output controls. Using this scan capability, the Eichelberger method provides for the state of the storage circuitry to be preconditioned and independent of its prior history. Selected propagation paths through the system circuitry are sensitized by test patterns from an automatic test generator. By altering selected inputs and cycling controls applied to the networks of combinatorial logic and their respective associated storage circuitry, propagation delay indications through selected paths are obtained to determine the status of these path delays through the logic system.

U.S. Pat. No. 4,063,080 to Eichelberger et al. teaches an organization of logic and arrays which is oriented towards testing of propagation delays. This organization employs clocked d.c. latches for all internal circuitry in the arithmetic, logical and control units of a computing system. The latch circuitry is partitioned along with associated combinatorial logic networks and arrays and arranged in sets. The sets of latch circuitry are coupled through combinatorial logic and arrays to other sets of latches that are controlled by system clock trains. Additional circuitry allows for all latches to become shift register latches and, by external control, to be connected into one or more shift registers. These shift registers are activated by clocks independent of the system clocks and, when the system clocks are deactivated, all sets of latches are isolated from each other. The effect of this isolation, coupled with the scan-in/scan-out capability is to reduce all sequential circuitry arrays fed by and, in turn, feeding combinatorial circuitry for purposes of measuring propagation delays through selected paths.

In addition to measuring propagation delay in large scale computing systems, a significant amount of time is spent analyzing the performance of the clock distribution system since it directly impacts the performance of a machine. The reason for this is that the performance of clocking systems in large scale systems directly impacts the overall performance of those systems since clock skew subtracts from the actual cycle time of a machine. For example, a machine theoretically running at a cycle time of seventeen nanoseconds actually has less than seventeen nanoseconds for register-to-register transfers. In fact, it can be considerably less than seventeen nanoseconds for several reasons, one of which is system clock skew. Clock skew is defined as the relative difference between any two different clock edges. The clock edges being compared could be from trigger clocks and latch clocks (in an LSSD environment), trigger clocks and array clocks, or the like.

In the past, clock system analysis consisted of clock delay measurements and comparisons which were extremely time consuming. An oscilloscope and associated measurement equipment were necessary to obtain the empirical results. By its very nature, this analysis was constrained by physical access to various points of interest in the clocking structure. Moreover, the loading effect of the oscilloscope probes on the physical access points contributed a relatively unknown amount of capacitance to the clock network making the resultant measurements less accurate. Additional assumptions were required to account for the loading introduced by the external measurement equipment.

As a practical matter, there often are hundreds of measurement points and it is impractical, due to constraints of time, to make measurements at all measurement points provided in the system. Therefore, a procedure has developed where measurements are done on a sample of the hardware, and conclusions regarding the overall clock system performance across all systems and modules are made based on this sample.

SUMMARY OF THE INVENTION

It is therefore an object of the present invention to provide a way to quickly and accurately find the delay for any logic or clock path in a computer system.

It is another object of the invention to provide a way to dynamically measure clock system performance without the need for external measurement equipment and the physical availability of probe points.

It is a further object of the invention to provide a measurement technique which is readily automated so that actual delays in logic or clock paths and relative delays between logic paths may be accurately and quickly determined.

According to the invention, there is provided a method of performing timing analysis using self-timing logic paths employing LSSD (Level Sensitive Scan Delay) logic pairs. LSSD logic pairs comprise a latch followed by a trigger, data being scanned in or out of the logic pair by an A and a B clock applied to the latch and the trigger, respectively. The system clocks include cycling latch and trigger clocks. Such LSSD logic is well understood by those skilled in the art as evidenced by the above mentioned patents to Eichelberger and Eichelberger et al. and U.S. Pat. No. 4,692,633 to Ngai et al., U.S. Pat. No. 4,580,137 to Fiedler et al., and U.S. Pat. No. 3,761,695 to Eichelberger.

The method according to the invention includes initializing the logic pair at the input end at opposite states and the latch at the output end to be of opposite state to the latch at the input end. Using the scan clocks available in LSSD latch designs, but in a modified sequence according to the invention, a set bit is scanned to the input of the sending trigger at the start of the path to be measured. The scan clocks are then gated off and, at this point, a complete cycle of the system clocks at a given cycle time is sent to the logic and the input and output LSSD pairs. The first system latch clock is inhibited at the input latch, allowing the system trigger clock to be first. This launches the set bit which then propagates through the logic path to the latch of the output LSSD pair. The system trigger clock is next inhibited after what would have been the second latch clock. This insures that the set bit is captured by the output latch if it propagates through the logic path during the given cycle time. The scan clocks are used once more to scan-out the data from the receiving latch. The output of the receiving trigger is compared with an expected output to detect if the set bit was received by the output latch. If the set bit is received at the output latch, the cycle time of the system clocks is reduced step by step, repeating the above steps until the set bit no longer reaches the output latch. At this point, the delay is determined to be equal to the minimum cycle time of the system clocks that still allow the set bit to propagate through the logic path and be latched by the output latch.

This technique provides a measurement of the delay between any two points. The technique is also applied to measure the relative delay between points in the system to provide a measure, for example, of clock skew. By measuring the delays between a common clock distribution point and each of a plurality of receiving points and computing the differences between these delays, the skew between these points is easily determined.

The method of performing system timing analysis using self-timing logic paths according to the invention permits any path in the machine to be easily timed whether "probe points" are available or not, and with no need for long delay equations. Accuracy is also increased significantly since the machine is measuring its own physical hardware performance, not a statistical approximation. This is very important since the performance of hardware on separate machines can be substantially different. Therefore, the invention allows for the first time a machine to time logic and clock paths within itself.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
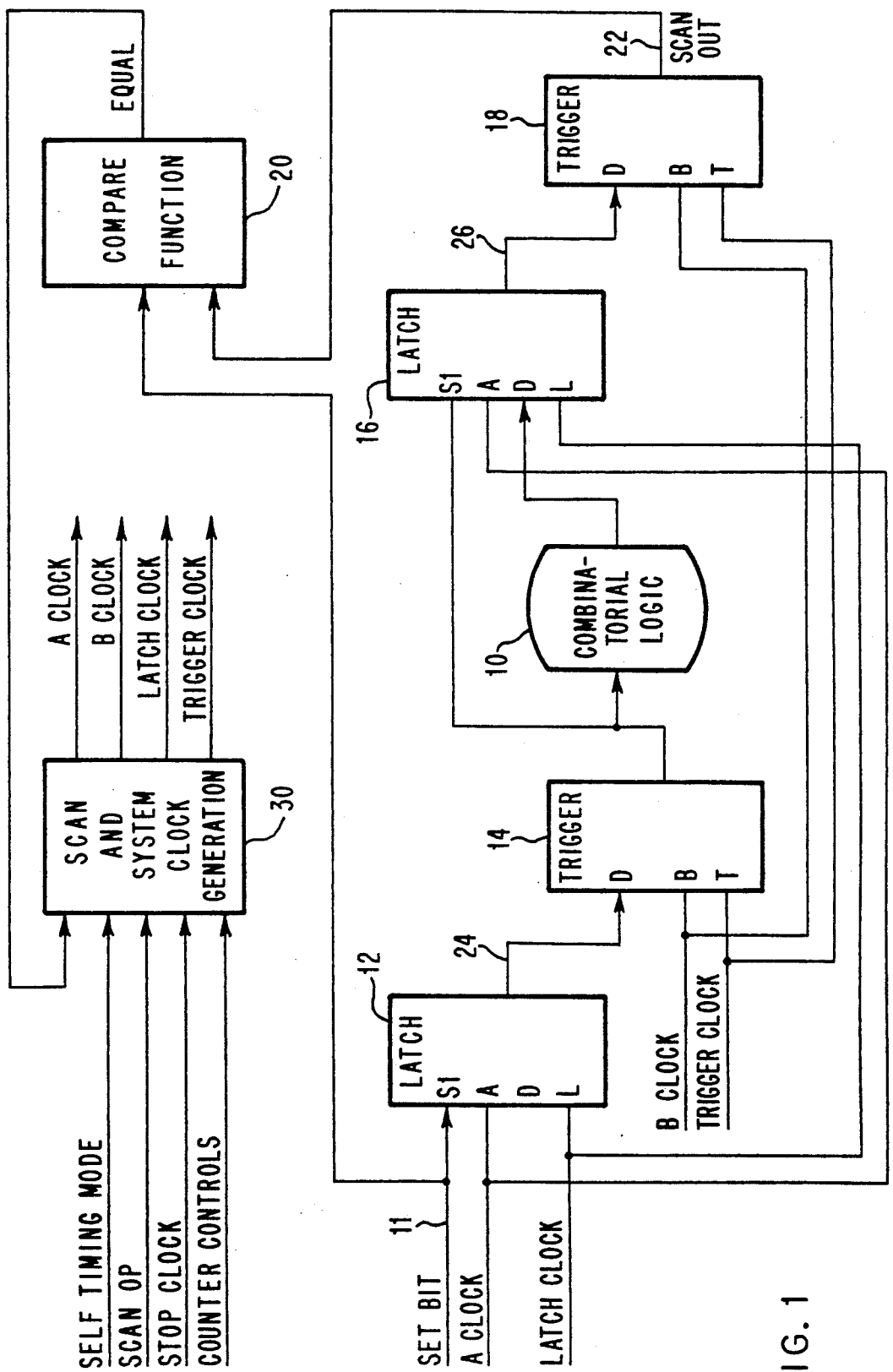
FIG. 1 is a generalized block diagram of a computer system showing the arrangement of LSSD logic pairs used to measure propagation delay through a path in the system.

Referring now to the drawings, and more particularly to FIG. 1, there is shown a block diagram that illustrates the principles of operation of the present invention. The combinatorial logic which defines a logic path to be measured is generally indicated at 10. At the input of the path are a first LSSD logic pair comprising a latch 12 and a trigger 14. At the output of the path are a second LSSD logic pair comprising a latch 16 and a trigger 18. Data is input to latch 12 at input terminal 11 and is output at terminal 22 from trigger 18. Each of latches 12 and 16 are supplied with an A clock and a latch clock (L), while each of triggers 14 and 18 are supplied with a B clock and a trigger clock (T). The A and B clocks for the latches 12 and 16 and the triggers 14 and 18, respectively, are for scanning the data in and out. The scan-in data A and B clocks sequence is illustrated in FIG. 4, the system latch and trigger clocks sequence is illustrated in FIG. 5, and the scan-out A and B clocks sequence is illustrated in FIG. 6.

The length of time through a logic path, or delay, that is of interest in FIG. 1 is from point 24 to point 26. This is the time it takes a data bit to pass through trigger 14, the combinatorial logic 10, and the receiving latch 16. Using the scan clocks available in LSSD latch designs, but in a sequence modified by this invention, a set bit, S, is scanned to the input of the sending trigger, 14, at the start of the path to be measured. This is accomplished by inhibiting the last B clock, as shown in FIG. 4, to force the set bit, S, to the input of the trigger point 24. The set bit, S, is the last bit to be scanned in its LSSD scan ring. This sequence of cycling the scan clocks is unique to this invention and allows for the "arming" of trigger 14. These clocks are then turned off. At this point, a complete cycle of the system clocks (also with a unique sequence), at a given cycle time $T_c$, is then sent to the logic, as illustrated in FIG. 5. This allows the propagation of the set bit from the trigger point 24 to the latch 16 at the end of the path at point 26. This sequence of cycling the system clocks is unique since the first latch pulse and the last trigger pulse are gated off, as indicated by the dotted lines in FIG. 5, to insure that the set bit is correctly propagated through the logic 10 after being launched by the trigger 14.

Figure 6:
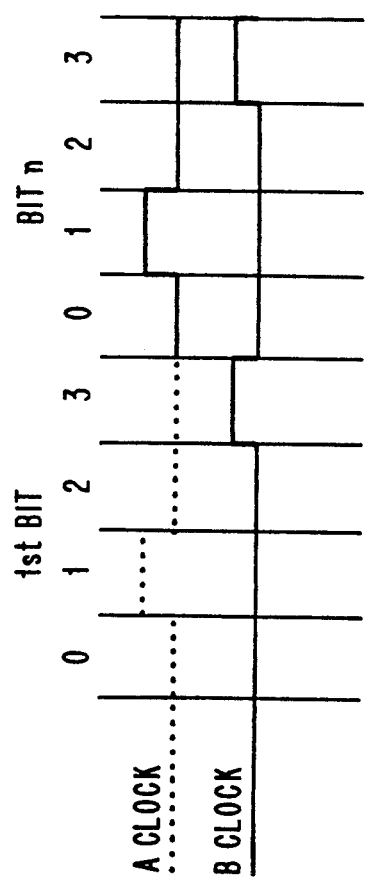
FIG. 6 is a timing diagram illustrating the A clock and B clock of scan-out data.

The unique sequence of scan clocks, as shown in FIG. 6, are used once more to "scan out" the data from the receiving latch. The clocks begin with the B-clock to insure the data is scanned out of the latch 16 without being modified by the A clock. The data bit found in the latch is then compared with the expected value. If the bit found in the latch 16 matches the expected value as determined by the compare logic 20, the path length is less than or equal to the cycle time of the system clocks, $T_c$. The cycle time is then decreased by a predetermined amount, and the entire process is repeated until the data bit found in the receiving latch 16 no longer matches the expected value. This is accomplished by controlling the scan and system clocks 30 with the output of the compare 20 logic when bits scanned out on line 22 match. When bits no longer match, the actual path delay is known. The delay is simply equal to the cycle time used in the previous iteration. In other words, the delay through the path is equal to the minimum cycle time of the system clocks that still allowed the set bit to propagate through the path and be latched by the receiving latch 16.

Figure 2:
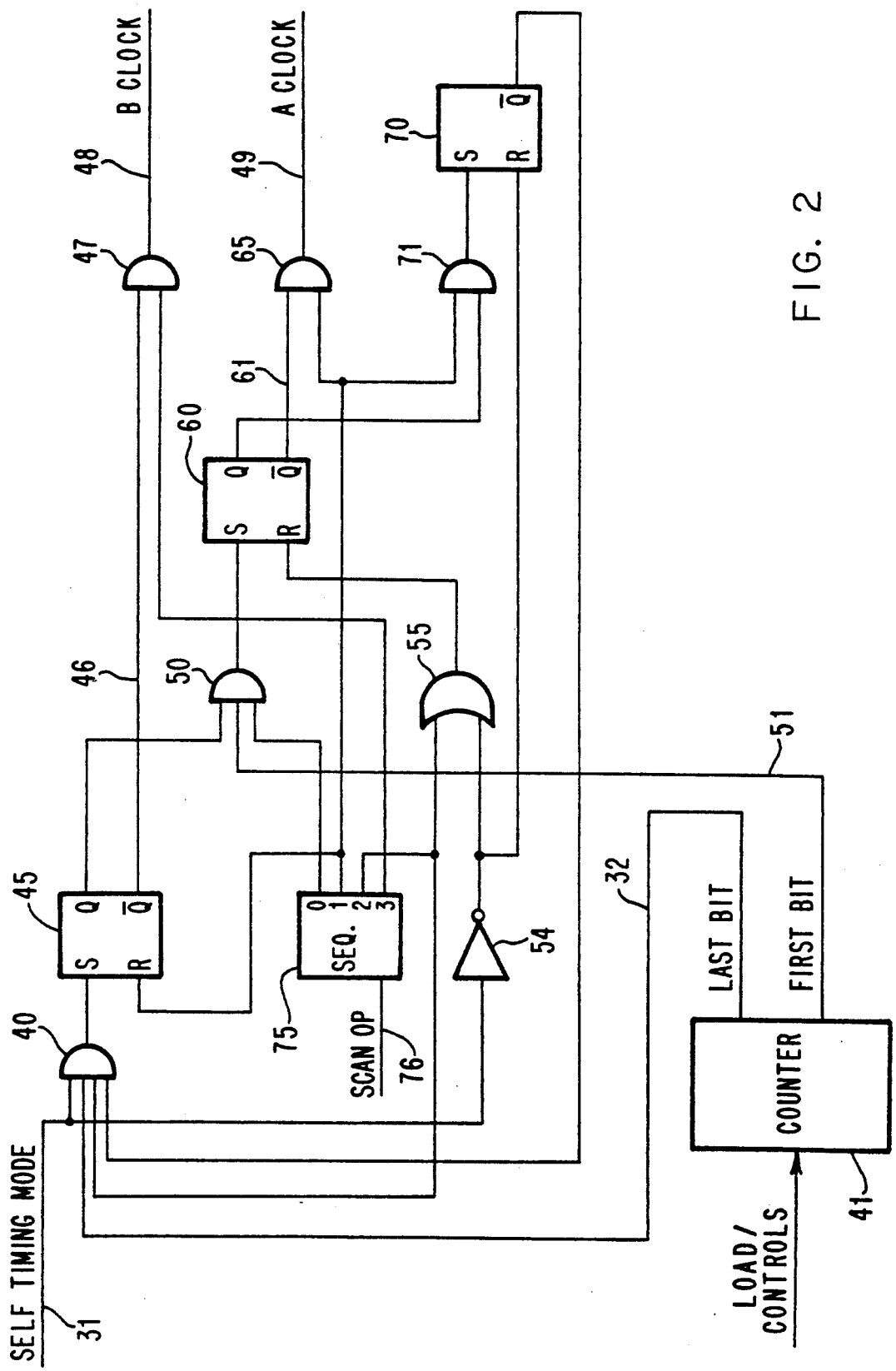
FIG. 2 is a logic diagram for the circuitry that generates the A and B clocks for the latch and trigger circuits in FIG. 1.
Figure 3:
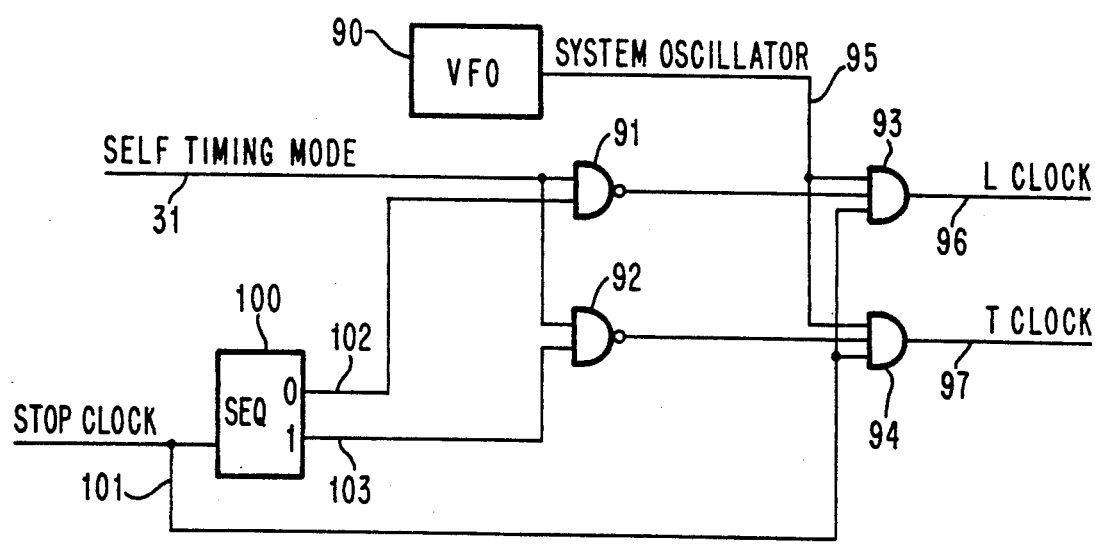
FIG. 3 is a logic diagram for the circuitry that generates the L and T clocks for the latch and trigger circuits in FIG. 1.
Figure 5:
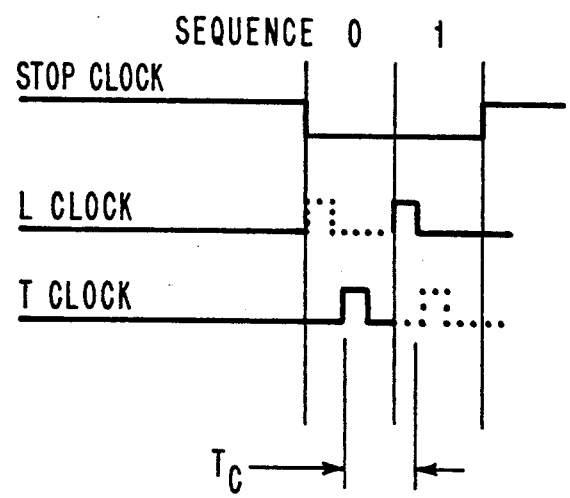
FIG. 5 is a timing diagram illustrating the cycling of system clocks.
Figure 4:
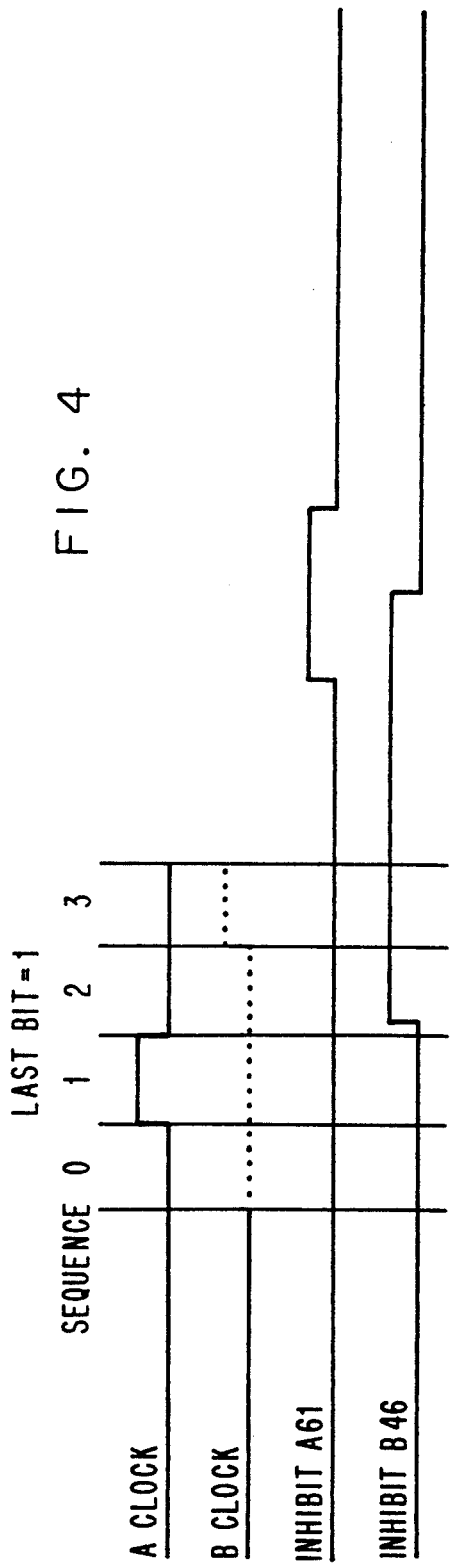
FIG. 4 is a timing diagram illustrating the A clock and B clock of scan-in data.

The logic circuitry shown in FIGS. 2 and 3 is for the purpose of altering the normal A/B and Latch/Trigger clock sequences, respectively, to generate the unique clock signal sequences shown in FIGS. 4, 5 and 6. With reference first to FIG. 2, the logic comprises three set/reset latches 45, 60 and 70 and a sequencer 75. The sequencer 75 may be implemented, for example, by a two stage binary counter driven by the system clock providing counts from zero to three, referred to as Scan Sequence 0 to Scan Sequence 3. The scan clock A is generated by Scan Sequence 1. The scan clock B is generated by Scan Sequence 3. Since scan operations are typically slower than system cycles, their clock rate or frequency is also slower. In the case being described, it is equal to one fourth the normal system clock rate; hence, a four bit sequencer.

The normal sequence for A/B clocks is an A/B pair, but in the self-timing sequence according to the invention, this sequence is modified. The self-timing mode on line 31 is initially inactive, resetting latches 60 and 70 (i.e., the Q output is "0", and the $\bar{Q}$ output is "1") via inverter 54. This allows normal clock sequences to occur. To time a path, the self-timing mode on line 31 is activated and scan operation control on line 76 is activated, causing sequencer 75 to start sequencing. The self-timing mode control on line 31 is activated under either manual or software control. When active in the logical "1" state, it signifies that the self-timing mode function is active. The scan operation control on line 76 is activated under either manual or software control. When active in the logical "1" state, it signifies that the LSSD latch/trigger pairs are in scan mode.

When the set bit, S, at terminal 11 reaches latch 12 in FIG. 1, last bit on line 32 goes active conditioning AND gate 40. In LSSD designs, each latch/trigger pair represents one scan bit in a given scan ring. A counter 41 in FIG. 2 is loaded with the number of bits to be scanned, and the A/B clock sequence is activated until the counter reaches a count of "1" (assuming a count-down counter). A count of "1" activates the last bit on line 32. If, for example, the set bit, S, at terminal 11 is bit position "30" in a ring of 100 bits, the counter would be loaded with a count of "30". Upon decrementing to a count of "1", the set bit, S, would be at latch 12, and the last bit on line 32 would go active.

On Scan Sequence 2 from sequencer 75, latch 45 is set causing the $\bar{Q}$ output on line 46 to go to "0" thereby inhibiting an output from AND gate 47 and inhibiting Scan Sequence 3 from activating the B clock on line 48. This is shown in FIG. 4 by the dashed line for the B clock. Scan operation control on line 76 is then deactivated. Thus, at this point latch 12 in FIG. 1 has the desired value to be propagated when the system (Trigger/Latch) clocks are activated.

The normal sequence for system clocks is latch followed by trigger clock. What is required for self-timing is a trigger followed by a latch clock, and this is produced by the logic shown in FIG. 3. This logic comprises a two stage sequencer which may be implemented with a single binary counter stage driven by the system clock. A similar notation is used as with sequencer 75 so that the two outputs of the sequencer 100 are referred to as Sequence 0 and Sequence 1.

With self-timing mode 31 still active, stop clock on line 101 is deactivated for two system clock cycles. The stop clock control on line 101 is controlled under either manual or software control. When active in the logical "1" state, it inhibits the system latch/trigger clocks from being generated. When in the logical "0" state, or inactive, system latch/trigger clocks are generated.

Sequence 0 on line 102 out of sequencer 100 is provided as one input to NAND gate 91 with self-timing mode on line 31 as the other input. This produces a "0" output from NAND gate 91 inhibiting AND gate 93 so that the system oscillator signal on line 95 from variable frequency oscillator (VFO) 90 does not generate a latch clock, L, on line 96. This is shown in FIG. 5 by a dashed line for the first latch clock. However, Sequence 1 from sequencer 100 is inactive so that the output of NAND gate 92 is a "1" thus allowing the system oscillator signal on line 95 to pass AND gate 94 and generate a trigger clock, T, on line 97.

At the end of the first system clock cycle, sequencer 100 advances, and Sequence 0 goes inactive and Sequence 1 goes active. In the second system clock cycle, a latch clock, L, will be generated on line 96 since NAND gate 91 now produces a "1" output by virtue of input Sequence 0 being inactive. However, Sequence 1 being active causes NAND gate 92 to produce a "0" output, since self-timing mode on line 31 is still active, thereby inhibiting the generation of the trigger clock, T, on line 97. This is shown in FIG. 5 by a dashed line for the second trigger clock. At the end of the second cycle, stop clock 101 goes active thus stopping the sequence.

These two sequences have allowed the set bit, S, at terminal 11 to be propagated from the input to trigger block 14, by the trigger clock, T, on line 97, to latch 16 and latched, by latch clock, L, on line 96. The scan out sequence to determine if the set bit, S, arrived at latch 16 also requires a special sequence of scan clocks A/B and reference is again made to FIG. 2. Scan operation control on line 76 is again activated. Latch 45 is still set from the scan-in operation thus conditioning AND gate 50. With sequencer 75 output Sequence 0 active and first bit on line 51 active, the output of AND gate 50 sets latch 60. The first bit line 51 is activated when the first bit of a scan ring is being scanned. This can be activated by counter 41 in FIG. 2, indicating the first scan cycle. The $\overline{Q}$ output from latch 60 on line 61 inhibits AND gate 65 thereby inhibiting the Sequence 1 output from sequencer 75 from generating the A clock for only this cycle. This is shown in FIG. 6 by the dashed line for the first A clock. When Sequence 1 from sequencer 75 goes active in this first cycle, latch 45 is reset such that its $\overline{Q}$ output on line 46 is "1". This conditions AND gate 47 thus allowing the B clock (Sequence 3) to be generated. When Sequence 2 from sequencer 75 goes active (still in the first cycle), the output of OR gate 55 resets latch 60, allowing normal A clock sequences in succeeding scan cycles. The resetting of latch 60 activates its Q output which conditions AND gate 71. When Sequence 1 from sequencer 75 goes active in the second scan cycle, latch 70 is set. The $\overline{Q}$ output on line 72 then inhibits AND gate 40 thus insuring that the remaining scan cycles to scan out the set bit operate in normal scan clock sequences. Latch 70 is reset when self-timing mode 31 is deactivated.

Figure 7:
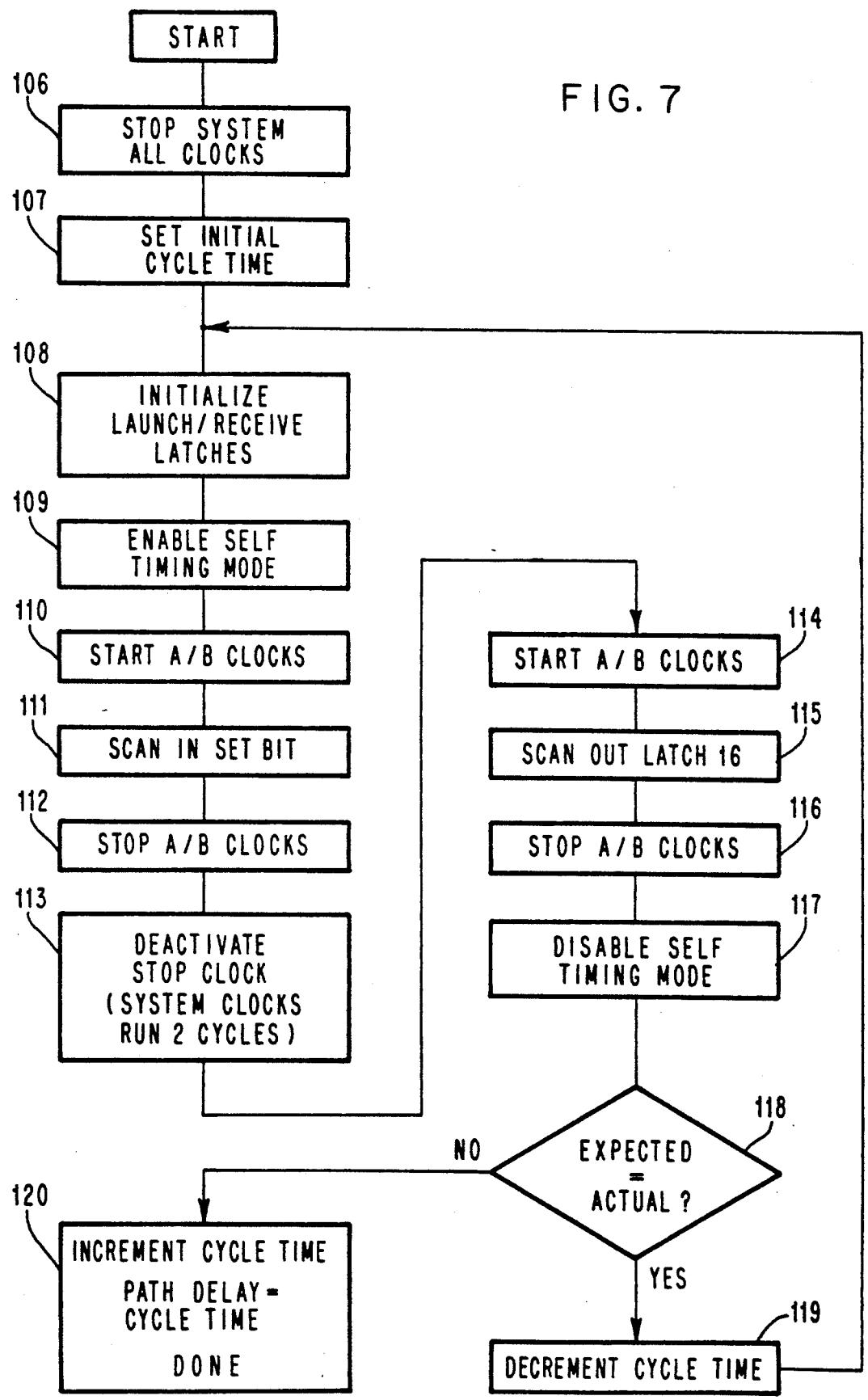
FIG. 7 is a flow diagram of the logic for the timing analysis process according to the invention.

The process may be implemented in software or firmware as well as the logic shown in FIGS. 2 and 3. The flow chart shown in FIG. 7 illustrates the logic of both the hardware and software implementations and, in the case of a software implementation, suitable source code can be written by a programmer skilled in the art based on this flow chart. With reference to FIG. 7, the process starts by stopping all system clocks in function block 106. This is the stop clock signal shown in FIG. 4. The initial cycle time, $T_c$, is set in function block 107. This is done, for example, by setting the frequency of the variable frequency oscillator 90 which is used as the system clock. Next, the launch and receive latches 12 and 16 are initialized in function block 108. The self-timing mode is enabled in function block 109 before starting the A/B clocks in function block 110. In the hardware implementation, the A/B clocks are started with the scan operation control on line 76 in FIG. 2. With the starting of the A/B clocks, the set bit, S, is scanned in on latch 12, as indicated by function block 111. At this point, the A/B clocks are stopped in function block 112 and, in function block 113, the stop clock is deactivated allowing the system clocks to run for two cycles. This produces the trigger clock T followed by the latch clock L shown in FIG. 5. The A/B clocks are restarted in function block 114 to produce the clock pattern shown in FIG. 6 and scan out latch 16, as indicated by function block 115. The A/B clocks are again stopped in function block 116, and then the self-timing mode is disabled in function block 117. A test is next made in decision block 118 to determine if the expected output is equal to the actual output from latch 16. If so, the cycle time is decremented by one interval in function block 119, and the process loops back to function block 108 to repeat the process. The size of the interval by which the cycle time is decremented determines the precision of the measurement and can be adjusted accordingly. If on the other hand the expected output is not equal to the actual output from latch 16, then the cycle time is incremented by one VFO interval and the path delay is set equal to the cycle time in function block 120 before the process ends.

Figure 8:
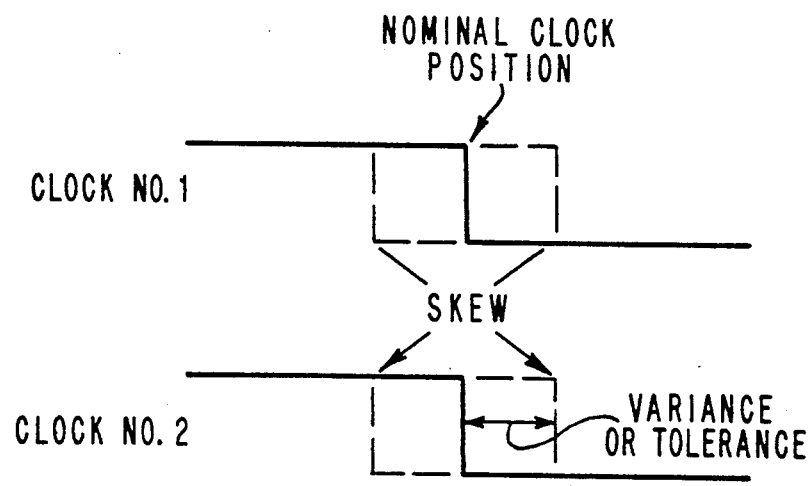
FIG. 8 is a timing diagram illustrating clock skew in a large system.

By measuring the delays from a common originating point to several receiving points and then taking the differences to calculate relative delays at each of the several receiving points, the invention can be applied to the analysis of the clock distribution system in a large, complex computer system. In past and present large systems, clock skews were measured with the aid of an oscilloscope and probes. FIG. 8 illustrates the concept of clock skew. The clock skew for a clock distribution system can be numerically described in terms of a statistical component, due, for example, to power supply fluctuations, temperature variations, and the like, combined with a nominal variation component, due, for example, to actual physical variations such as wire capacitance, wire lengths, and the like. The accuracy of the measurements made with the invention is significantly higher than with prior art techniques because statistical and nominal variations physically present in a particular machine are automatically taken into account. Also, there no longer exist any detrimental loading effects introduced when attaching an oscilloscope's probes to the highly tuned clock distribution system.

Figure 9:
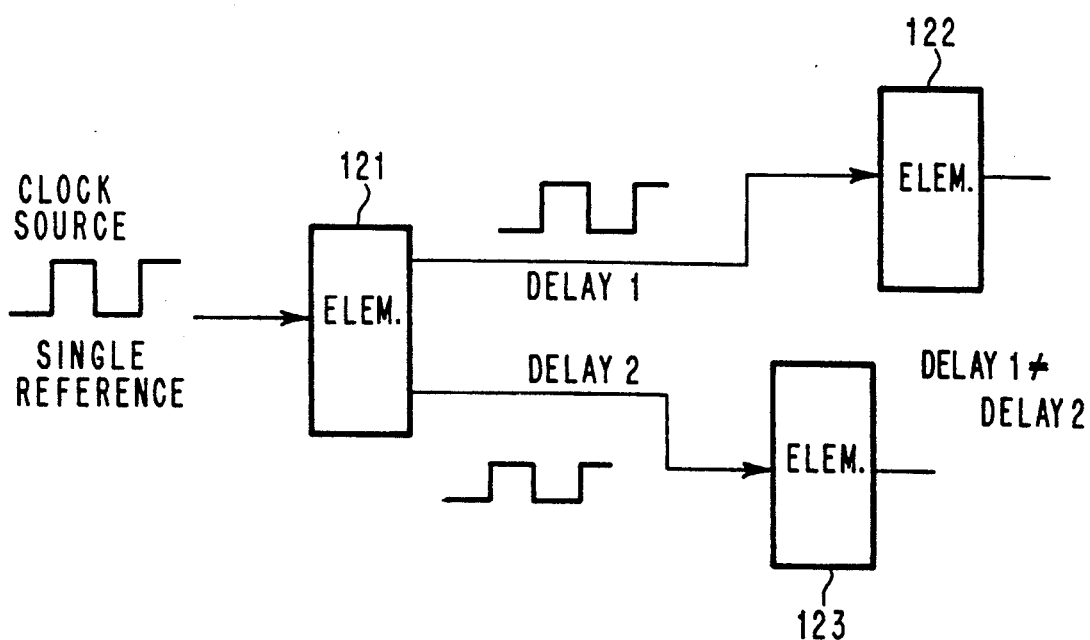
FIG. 9 is a simplified block diagram illustrating a clock distribution system.

FIG. 9 shows in simplified block diagram form a clock distribution system. In this system, there are three hierarchical elements in the clock system to be analyzed. These hierarchical elements could be chips, boards or even whole systems. A single clock source is applied to element 121 which, in turn, sends separate copies of the clock to elements 122 and 123. This hypothetical system was, by definition, designed such that the delay between elements 121 and 122 was equal to the delay between elements 121 and 123 but, in an actual system, statistical and nominal variations cause these two delays not to be equal producing clock skew between the elements 122 and 123.

Figure 10:
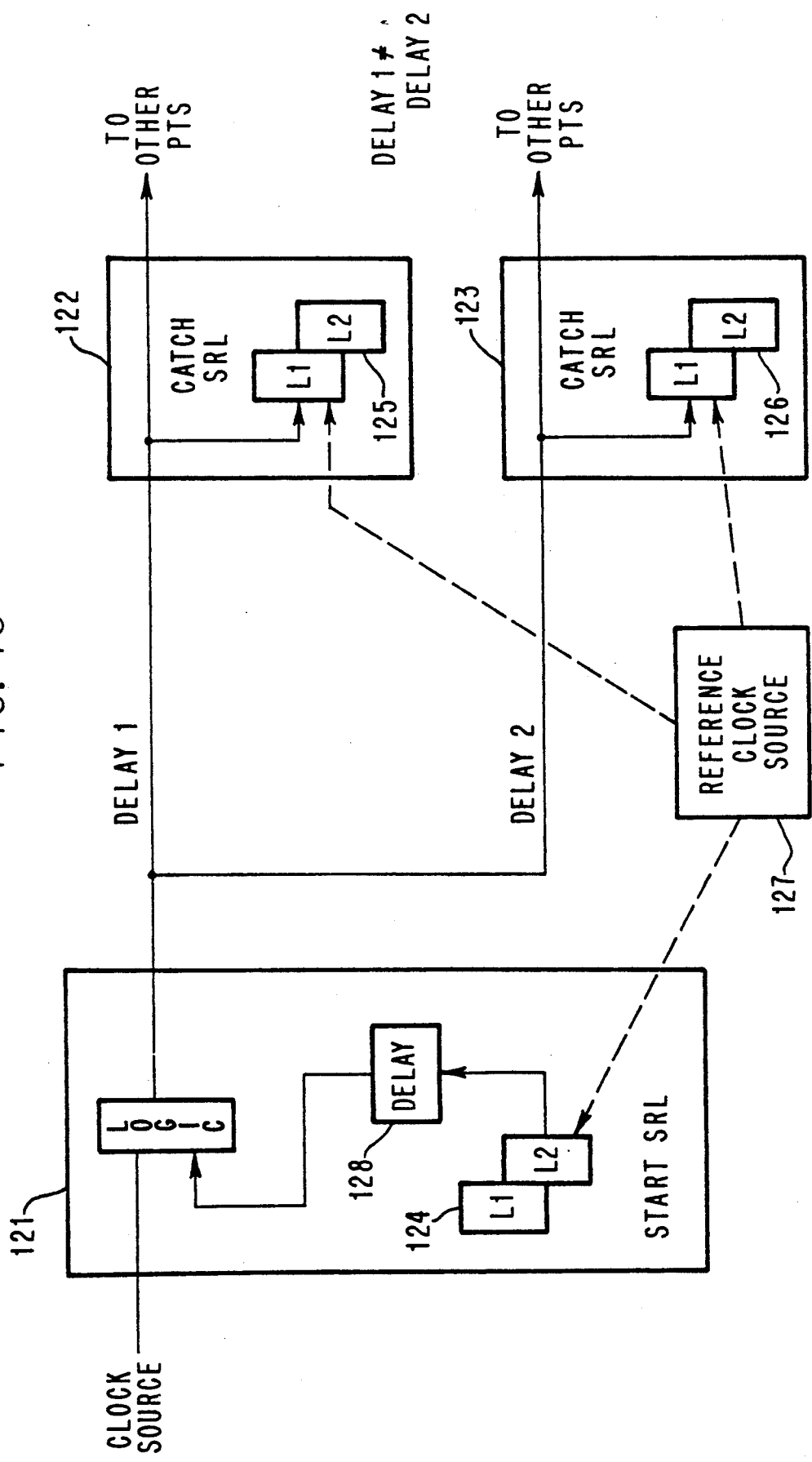
FIG. 10 is a block diagram illustrating the application of the present invention to the analysis of a clock distribution.

To determine the amount of skew, it is necessary to perform an analysis between elements 121 and 122 and between elements 121 and 123. This is accomplished, applying the principles of the invention, as illustrated in FIG. 10. Shift register latches (SRLs), comprising latch/trigger pairs, have been added to elements 121, 122 and 123 of the clock distribution system. A start SRL 124 is added to element 121, and catch SRLs 125 and 126 are added to elements 122 and 123, respectively. A common reference clock 127 is supplied to each of the SRLs being used for skew measurement. A variable frequency oscillator is used to increase or decrease cycle time as in the basic self-timing function. An artificial delay block 128 has been added to the self timing clock path so that the total delay is within the system under test scan operation capability and the variable frequency oscillator capability.

In operation, the start and catch SRLs are initialized by scanning a set bit, S, of opposing values into the start SRL 124 and the catch SRLs 125 and 126. The scan-in operation employs the self-timing scan-in clock sequence leaving the set bits in the latch portions of the SRLs. Using the self-timing sequencing of the system clocks described above, a single reference trigger is supplied simultaneously to the start and catch SRLs followed at some known interval, $T_c$, by a reference latch clock. The setting of the variable frequency oscillator determines the interval between the two reference clocks. Finally, using the self-timing scan-out clock sequence, data in the catch SRLs is examined to determine whether or not the set bit was successfully propagated from the start SRL 124.

Assuming that the initial interval between the reference trigger and reference latch clocks was greater than the delay between elements 121 and 122 and between elements 121 and 123, the set bit, S, will be present in both the catch SRLs 125 and 126. The process is reiterated after decreasing the cycle time by a predetermined amount. The catch SRLs 125 and 126 are again examined at the end of the process to determine if the set bit, S, is present. This procedure continues until the set bit, S, no longer propagates to one of the catch SRLs 125 or 126. The propagation delay between the start and catch SRLs is simply the cycle time used in the previous iteration that allowed the set bit, S, to propagate. The difference between successive intervals of the reference clocks is predictable and is kept quite small, normally on the order of tens of picoseconds. This procedure resumes and continues until the set bit, S, no longer successfully propagates to the other catch SRL 126 or 125. The propagation delay for this SRL is then the cycle time used in the previous iteration that allowed the set bit, S, to propagate.

At this time, both distinct paths have been dynamically measured using this invention and the resultant delays may be compared. The difference between the propagation delays from element 121 to element 122 and from element 121 to element 123 is the relative skew between elements 122 and 123. Therefore, using the invention, the skew between clocks at any two points in a clock distribution system may be measured quickly and accurately without the need for external measurement equipment.

Major benefits from the use of the invention to measure clock skew include very fast analysis time which allows a large sample of hardware of a large, complex computer system to be examined, with no limitation of measurement points by physically accessible locations and an increased accuracy limited only to the granularity of the interval settings of the reference latch and trigger. Controlling the clocks by hardware logic adds relatively little to the cost of the system. However, those skilled in the art will recognize that these clocks can be controlled by small software modifications to the logic support system code and minor modifications to the clock gating hardware. Thus, while the invention has been described in terms of preferred hardware and software embodiments, those skilled in the art will recognize that the invention can be practiced with modification within the spirit and scope of the appended claims.

Having thus described our invention, what we claim as new and desire to secure by Letters Patent is as follows:

1. In a system having level sensitive scan delay latch pairs composed of a latch and a trigger, and clock means for providing system latch clock signals and system trigger clock signals, respectively, to each of said latch and said trigger comprising said latch pairs, said system being normally started with a system latch clock signal and stopped on a system trigger clock signal and further having an A scan clock signal to latches followed by a B scan clock signal to triggers of said latch pairs, a system for determining the propagation delay between any two of said latch pairs comprising:

means for initializing a latch and a trigger of an input latch pair to opposite states and a latch of an output latch pair to a state opposite said latch of said input latch pair;

means for providing a set bit to an output of said latch of said input latch pair;

means for operating said A and B scan clocks to scan in said set bit to said trigger of said input latch pair;

means for setting a cycle time between successive system trigger clock signals;

means for inhibiting a first system latch clock signal at said latch of said input latch pair allowing a first system trigger clock signal to be first in time to launch said set bit from said trigger of said input latch pair and initiate the determination of said propagation delay;

means for inhibiting a second system trigger clock signal allowing said set bit to be received and held by said latch of said output latch pair; and means for operating said A and B scan clocks to scan out data from said latch of said output latch pair.

2. The system recited in claim 1 further comprising:

means for comparing an output of said trigger of said output latch pair with an expected set bit; and means for adjusting said cycle time until a minimum time period of said system latch and system trigger clocks is detected that will permit said set bit to be propagated and latched in said latch of said output latch pair.

3. The system recited in claim 1 wherein delays are determined between a reference input latch pair and each of a first and second output latch pairs, further comprising means for calculating the relative delay for each of said first and second output latch pairs, said relative delay providing a measure of clock skew.

4. The system recited in claim 1 wherein said means for operating said A and B scan clocks to scan in data and to scan out data comprise:

first and second set/reset latches;

first sequencer means for generating a plurality of outputs corresponding to a plurality of sequence states, two of said plurality of sequence states corresponding to said A and B scan clocks;

first AND gate connected to an output of said sequencer means generating said B scan clock signal, said AND gate further being connected to and inhibited by said first set/reset latch when said first set/reset latch is set;

second AND gate connected to an output of said first sequencer means generating said A scan clock signal, said AND gate further being connected to and inhibited by said second set/reset latch when said first set/reset latch is set;

means controlled by said first sequencer means for setting said first set/reset latch after said set bit has been scanned into said trigger of said input latch pair; and means controlled by said first sequencer means for setting said second set/reset latch after said cycle time expires.

5. The system recited in claim 4 wherein said means for setting a cycle time between successive system trigger clock signals includes an oscillator having a frequency which is varied to adjust said cycle time and said means for inhibiting a first system latch clock signal comprises:

second sequencer means for generating a plurality of outputs corresponding to a plurality of sequence states;

third and fourth AND gates connected to said oscillator for passing, respectively, said latch clock signal and said trigger clock signal;

first logic means responsive to a first output from said second sequencer means and a self-timing mode signal for enabling said third AND gate; and second logic means responsive to a second output from said second sequencer means and said self-timing mode signal for enabling said fourth AND gate.

6. The system recited in claim 5 wherein delays are determined between a reference input latch pair and each of a first and second output latch pairs, further comprising means for calculating the relative delay for each of said first and second output latch pairs, said relative delay providing a measure of clock skew.

7. In a system having level sensitive scan delay latch pairs composed of a latch and a trigger, and clock means for providing system latch clock signals and system trigger clock signals, respectively, to each of said latch and said trigger comprising said latch pairs, said system being normally started with a system latch clock signal and stopped on a system trigger clock signal and further having an A scan clock signal to latches followed by a B scan clock signal to triggers of said latch pairs, a method for determining the propagation delay between any pair of said latch pairs comprising the steps of:

initializing a latch and a trigger of an input latch pair to opposite states and a latch of an output latch pair to a state opposite said latch of said input latch pair;

providing a set bit to an output of said latch of said input latch pair;

operating said A and B scan clocks to scan in said set bit to said trigger of said input latch pair;

setting a cycle time between successive system rigger clock signals;

inhibiting a first system latch clock signal at said latch of said input latch pair allowing a first system trigger clock signal to be first in time to launch said set bit from said trigger of said input latch pair and initiate the determination of said propagation delay;

inhibiting a second system trigger clock signal allowing said set bit to be received and held by said latch of said output latch pair; and operating said A and B scan clocks to scan out data from said latch of said output latch pair.

8. The method recited in claim 7 further comprising the steps of:

comparing an output of said trigger of said output latch pair with an expected set bit; and adjusting said cycle time until a minimum time period of said system latch and system trigger clocks is detected that will permit said set bit to be propagated and latched in said latch of said output latch pair.

9. The method recited in claim 7 wherein delays are determined between a reference input latch pair and each of a first and second output latch pairs, further comprising the step of calculating the relative delay for each of said first and second output latch pairs, said relative delay providing a measure of clock skew.

10. The method recited in claim 9 wherein said steps of operating said scan clocks to scan in data and to scan out data comprise:

generating a plurality of sequence states, two of said plurality of sequence states corresponding to said A and B scan clocks;

gating a first sequence state to generate said B scan clock signal;

gating a second sequence state to generate said A scan clock signal;

inhibiting the gating of said first sequence state after said set bit has been scanned into said trigger of said input latch pair; and inhibiting the gating of said second sequence state after said cycle time expires.

11. The method recited in claim 10 wherein said step of setting a cycle time between successive system trigger clock signals comprises varying a frequency of an oscillator to adjust said cycle time and said step for inhibiting a first system latch clock signal comprises:

generating a second plurality of sequence states;

separately gating an output of said oscillator to respectively pass said latch clock signal and said trigger clock signal;

inhibiting the gating of said latch clock signal during a first one of said second plurality of sequence states; and inhibiting the gating of said trigger clock signal during a second one of said second plurality of sequence states.

12. The method recited in claim 11 wherein delays are determined between a reference input latch pair and each of a first and second output latch pair, further comprising the step of calculating the relative delay for each of said first and second output latch pairs, said relative delay providing a measure of clock skew.

* * * * *